United States Patent
Kodama (10) Patent No.: US 9,543,029 B2
(45) Date of Patent: Jan. 10, 2017

(54) NON-VOLATILE SEMICONDUCTOR MEMORY DEVICE AND READING METHOD FOR NON-VOLATILE SEMICONDUCTOR MEMORY DEVICE THAT INCLUDES CHARGING OF DATA LATCH INPUT NODE PRIOR TO LATCHING OF SENSED DATA

(71) Applicant: KABUSHIKI KAISHA TOSHIBA, Tokyo (JP)

(72) Inventor: Takuyo Kodama, Sagamihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/820,289

(22) Filed: Aug. 6, 2015

(65) Prior Publication Data
US 2016/0042798 A1    Feb. 11, 2016

(30) Foreign Application Priority Data
Aug. 7, 2014  (JP) ................. 2014-161315

(51) Int. Cl.
*G11C 16/04*    (2006.01)
*G11C 16/06*    (2006.01)
*G11C 16/26*    (2006.01)
*G11C 16/32*    (2006.01)

(52) U.S. Cl.
CPC ........... *G11C 16/26* (2013.01); *G11C 16/0483* (2013.01); *G11C 16/32* (2013.01)

(58) Field of Classification Search
CPC ...... G11C 16/26; G11C 16/32; G11C 16/0483
USPC ........... 365/185.05, 185.18, 185.21, 185.25, 365/189.05, 189.17
See application file for complete search history.

(56) References Cited

U.S. PATENT DOCUMENTS 6,373,746 B1 * 4/2002 Takeuchi ............. G11C 7/1051
                                                    365/185.03
7,016,230 B2 * 3/2006 Hosono ................ G11C 16/344
                                                    365/185.17

FOREIGN PATENT DOCUMENTS

JP        2014-099228 A    5/2014

* cited by examiner

*Primary Examiner* — Tha-o H Bui
(74) *Attorney, Agent, or Firm* — Patterson & Sheridan, LLP (57) ABSTRACT

A non-volatile semiconductor memory device includes a memory cell, and a sense amplifier that includes a latch unit, a first transistor having a first end electrically connected to the latch unit and a second end electrically connected to a first node, a second transistor having a first end electrically connected to the first node and a second end electrically connected to the memory cell, and a third transistor having a first end electrically connected to a second node between the first end of the first transistor and the latch unit. A control unit of the device controls the sense amplifier during a read operation, to charge the second node to a first voltage, and then charge the first node to a second voltage, turn on the second transistor after charging the first node to the second voltage, and turn on the third transistor after turning on the second transistor.

19 Claims, 8 Drawing Sheets

NON-VOLATILE SEMICONDUCTOR MEMORY DEVICE AND READING METHOD FOR NON-VOLATILE SEMICONDUCTOR MEMORY DEVICE THAT INCLUDES CHARGING OF DATA LATCH INPUT NODE PRIOR TO LATCHING OF SENSED DATA

CROSS-REFERENCE TO RELATED APPLICATION

This application is based upon and claims the benefit of priority from Japanese Patent Application No. 2014-161315, filed Aug. 7, 2014, the entire contents of which are incorporated herein by reference.

FIELD

Embodiments described herein relate generally to a non-volatile semiconductor memory device and a reading method.

BACKGROUND

A NAND-type flash memory includes memory cells disposed in a matrix configuration, a sense amplifier for sensing data written in the memory cells, and the like.

DETAILED DESCRIPTION

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or units, these elements, materials, regions, layers and/or units should not be limited by these terms. These terms are only used to distinguish one element, material, region, layer or unit from another element, material, region, layer or unit. Thus, a first element, material, region, layer or unit discussed below could be termed a second element, material, region, layer or unit without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross unit and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

The embodiments provide a non-volatile semiconductor memory device capable of reducing a circuit size and a reading method of the device.

In general, according to one embodiment, a non-volatile semiconductor memory device includes a memory cell, and a sense amplifier that includes a latch unit configured to hold data read from the memory cell, a first transistor having a first end electrically connected to the latch unit and a second end electrically connected to a first node, a second transistor having a first end electrically connected to the first node and a second end electrically connected to the memory cell, and a third transistor having a first end electrically connected to a second node between the first end of the first transistor and the latch unit. The non-volatile semiconductor memory device further includes a control unit that controls the sense amplifier during a read operation, to charge the second node to a first voltage, and then charge the first node to a second voltage, turn on the second transistor after charging the first node to the second voltage, and turn on the third transistor after turning on the second transistor.

First Embodiment

Configuration Example

Figure 1:
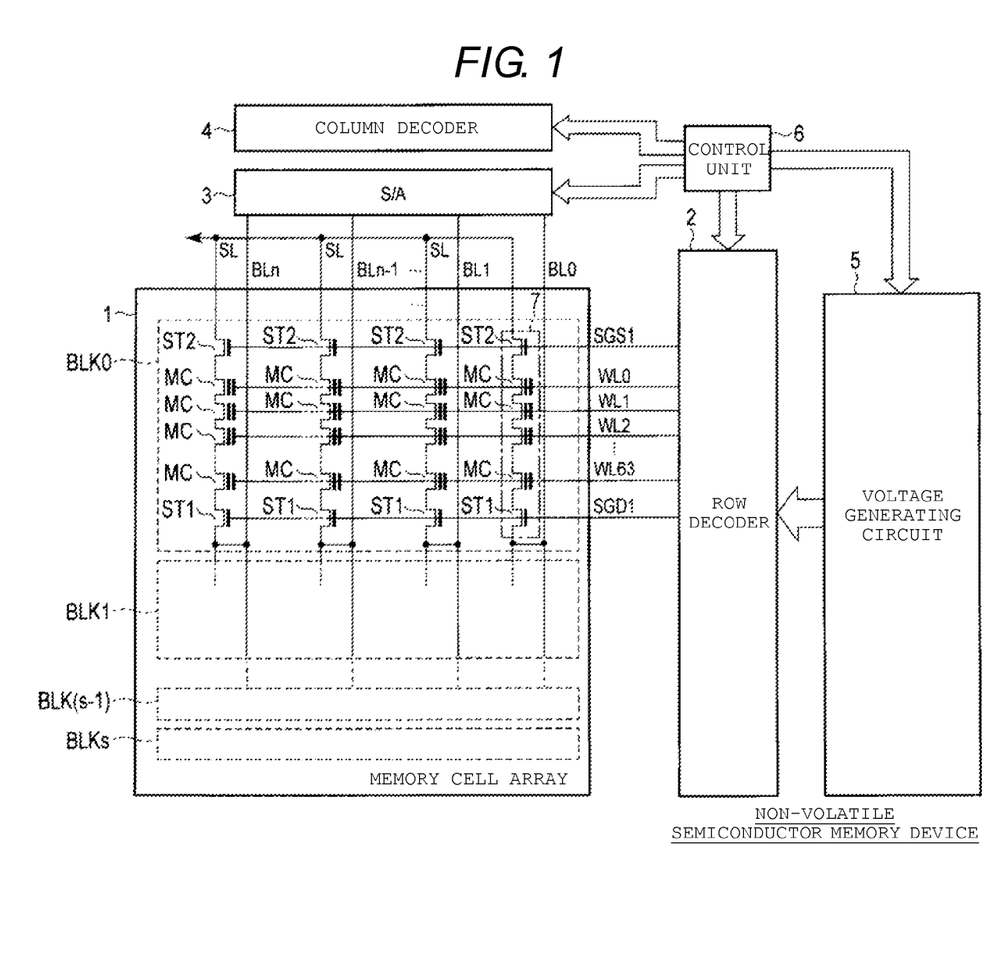
FIG. 1 is a diagram illustrating an example configuration of a non-volatile semiconductor memory device according to a first embodiment.

An overall configuration of a non-volatile semiconductor memory device according to a first embodiment will be described with reference to FIG. 1. FIG. 1 is a block diagram of a non-volatile semiconductor memory device according to the first embodiment.

As illustrated in FIG. 1, the non-volatile semiconductor memory device according to the first embodiment includes a memory cell array 1, a row decoder 2, a sense amplifier 3, a column decoder 4, a voltage generating circuit 5, and a control unit 6. First, the memory cell array 1 will be described.
Memory Cell Array 1

In FIG. 1, for example, the memory cell array 1 is a semiconductor memory including non-volatile memory cells MC capable of holding N-valued data (where N is two or more) and, for example, an NAND-type flash memory.

A control gate of a memory cell MC is connected to a word line WL and one end of a current path of the memory cell MC is connected to a bit line BL. Hereinafter, the memory cell array 1 will be described in detail.
Details of Memory Cell MC Next, as illustrated in FIG. 1, each of blocks BLK0 to BLKs includes a plurality of NAND strings 7 to which the non-volatile memory cells MC are connected in series. For example, each of the NAND strings 7 includes 64 memory cells MC and selection transistors ST1 and ST2.

The memory cell MC has a MONOS structure including a charge storage layer (for example, an insulation film) that is formed on a semiconductor substrate in which a gate insulation film is interposed therebetween, an insulation film (hereinafter, referred to as a block layer) that has a dielectric constant higher than that of the charge storage layer formed on the charge storage layer, and a control gate electrode that is formed on the block layer. Moreover, the number of the memory cells MC is not limited to 64 and may be 64, 128, 256, or the like, and there is no limit to this number.

The memory cells MC adjacent to each other share a source and a drain. Then, a current path is disposed so as to be connected in series between the selection transistors ST1 and ST2. A drain region of one end of the memory cells MC that is connected in series is connected to a source region of the selection transistor ST1 and a source region of the other end of the memory cells MC is connected to a drain region of the selection transistor ST2.

Control gate electrodes of the memory cells MC in the same line are commonly connected to one of word lines WL0 to WL63 and gate electrodes of the selection transistors ST1 and ST2 of the memory cells MC in the same line are commonly connected to selection gate lines SGD1 and SGS1 respectively.

Moreover, for the sake of simplifying description, hereinafter, in a case where there is no need to distinguish the word lines WL0 to WL63 from each other, the word lines WL0 to WL63 simply may be referred to as the word line WL. Furthermore, the drains of the selection transistors ST1 in the same line in the memory cell array 1 are commonly connected to one of bit lines BL0 to BLn.

Hereinafter, also in a case where there is no need to distinguish the bit lines BL0 to BLn from each other, the bit lines BL0 to BLn may be collectively referred to as the bit line BL (n: natural number). The sources of the selection transistors ST2 are commonly connected to a source line SL. Moreover, both the selection transistors ST1 and ST2 are not necessarily required and only one may be provided.

Furthermore, data is collectively written in a plurality of memory cells MC connected to the same word line WL and the unit of writing is referred to as page. Furthermore, data in the plurality of NAND strings 7 are collectively erased per block BLK.

Moreover, for example, in the embodiment, the memory cell MC may hold one of the binary data (1 bit). Two levels of the threshold voltage in the memory cell MC are an "E" level and a "C" level, where the "E" level is the lower voltage side.

The "E" level is referred to as an erase state and indicates a state where there is no charge in the charge storage layer. Then, if the charge is stored in the charge storage layer, the voltage is increased from the "E" level to the "C" level.

The memory cell MC of the erase state corresponds to "1" data and the memory cell MC in which threshold distribution is the "C" level corresponds to "0" data.

The configuration of the memory cell array 1 is not limited to the above configuration and, for example, may be a configuration described in U.S. patent application Ser. No. 12/407,403 filed Mar. 19, 2009 as "three dimensional stacked nonvolatile semiconductor memory". Furthermore, it may be a configuration described in U.S. patent application Ser. No. 12/406,524 filed Mar. 18, 2009 as "three dimensional stacked nonvolatile semiconductor memory", U.S. patent application Ser. No. 12/679,991 filed Mar. 25, 2010 as "non-volatile semiconductor storage device and method of manufacturing the same", and U.S. patent application Ser. No. 12/532,030 filed Mar. 23, 2009 as "semiconductor memory and method for manufacturing same". These patent applications are incorporated herein by reference in their entirety.
Row Decoder 2

Returning to FIG. 1, a peripheral circuit will be described.

The row decoder 2 selects a row of the memory cell array 1 and transfers the voltage generated by the voltage generating circuit 5 to the memory cell MC provided inside the selected block BLK.
Sense Amplifier 3

Next, the sense amplifier 3 will be described. The sense amplifier 3 may be connected to the bit line BL disposed on the memory cell array 1 in one to one correspondence.

The sense amplifier 3 has reading and writing functions of the data from and to the memory cell MC at the same time through the bit lines BL.

Column Decoder 4

The column decoder 4 outputs a column selection signal selecting the bit line BL of the memory cell array 1.

Voltage Generating Circuit 5

The voltage generating circuit 5 generates a voltage necessary for various operations of the memory cell array 1, the sense amplifier circuit 3, or the column decoder 4 such as a reading voltage, a writing voltage, and a verify voltage in response to various control signals supplied from the control unit 6.

Control Unit 6

The control unit 6 controls an entirety of the non-volatile semiconductor memory device. For example, the control unit 6 controls operation timing of writing operation, writing verify, and the like using a command received from a host (not illustrated).

Specifically, the control unit 6 controls ON, OFF of each transistor in the sense amplifier 3, and timing thereof.

Details of Sense Amplifier 3

Next, details of the sense amplifier 3 will be described with reference to FIG. 2. The sense amplifier 3 includes n-channel type MOS transistors 10, 11, 12, 14, 17 to 20, 23 to 31, and 36 to 37, p-channel type MOS transistors 14, 16, and 32 to 35, and a capacitor element 21.

As described above, the control unit 6 controls a voltage level of a signal supplied to the gate of each transistor, supply timing, and the like.

Furthermore, hereinafter, a threshold potential of the MOS transistor is indicated by adding a reference numeral of the MOS transistor to a threshold potential Vth of the MOS transistor. For example, the threshold potential of a MOS transistor 11 is Vth11.

One end of the current path of the MOS transistor 10 is connected to the bit line BL, a voltage VSS supplied to the other end, and a signal BLV is supplied to the gate. The MOS transistor 10 has a function of grounding the bit line.

One end of the current path of the MOS transistor 11 is connected to the bit line BL, the other end connected to the node N1, and a signal BLC is supplied to the gate. The signal BLC is a signal for clamping the bit line BL to a predetermined potential.

For example, if the signal BLC=(VDD+Vth11) is applied to the MOS transistor 11 in the writing operation, the MOS transistor 11 may supply a voltage VDD to the bit line BL.

One end of the current path of the MOS transistor 12 is connected to a node N1, and a signal BLY is supplied to the gate.

A voltage VDDSA is supplied to one end of the current path of the MOS transistor 14 and a signal FLG is supplied to the gate. When a voltage level of the signal FLG is "L", the voltage VDD is supplied to the bit line BL and the reading operation is performed.

One end of the current path of the MOS transistor 16 is connected to the node N1, the other end connected to a node N3, and a signal XXL is supplied to the gate. The MOS transistor 16 serves to connect the bit line BL and a SEN node. That is, when performing reading, the control unit 6 makes the voltage level of the signal XXL be "H", whereby the MOS transistor 16 is in an ON state and the bit line BL and the SEN node are connected.

One end of the current path of the MOS transistor 17 is connected to the node N3, a voltage VSAP=(voltage VX2+ voltage VDD) supplied to the other end, and a signal HLL is supplied to the gate. In the first embodiment, the MOS transistor 17 has a function of storing the charge corresponding to the voltage VX2 in the capacitor element 21.

One end of the current path of the MOS transistor 18 is connected to a node N3, the other end connected to a node N5, and a signal BLQ is supplied to the gate. The MOS transistor 18 has a function of connecting the SEN node and the bit line BL in a second embodiment described below.

One end of the current path of the MOS transistor 20 is connected to the node N4 to which CELSRC (>VSS) is supplied, and the node N3 is connected to the gate. A Trip Point of the MOS transistor 20 is artificially increased by supplying the CELSRC.

In the first embodiment, the MOS transistor 20 functions as a detection unit for detecting the read data.

Hereinafter, in the first embodiment, the gate of the MOS transistor 20 is referred to as the SEN node, the sense amplifier 3 transfers the data that is read out according to whether or not the MOS transistor 20 is ON, to a latch circuit (TDL).

One end of the current path of the MOS transistor 19 is connected to a node N5, and a signal STB is supplied to the gate. If the voltage level of the SEN is transferred to the TDL described below and the like, the signal STB is "H". Thus, the data detected by the SEN node may be transferred to the TDL.

One electrode of the capacitor element 21 is connected to the node N3 and the other electrode is connected to the node N4. In the first and second embodiments, supply of a clock signal from the node N4 to the other electrode of the capacitor element 21 is not performed.

One end of the current path of the MOS transistor 23 is connected to the node N5, the other end grounded, and a signal MTG is supplied to the gate.

One end of the current path of the MOS transistor 24 is connected to the node N5 and the gate is connected to a node N6.

A voltage VDDSA2 is supplied to one end of the current path of the MOS transistor 25, the other end connected to an end of the current path of the MOS transistor 24, and a signal STL is supplied to the gate.

One end of the current path of the MOS transistor 26 is connected to the node N6, the other end connected to the node N5, and a signal TTL is supplied the gate. The node N6 is also connected to a LAT_T.

The MOS transistor 26 functions as a switch circuit for charging the LAT_T and a voltage level of the signal TTL supplied to the gate of the MOS transistor 26 is, for example, a voltage V1.

One end of the current path of the MOS transistor 27 is connected to the node N6 and a signal LSL is supplied to the gate.

The voltage VDDSA2 is supplied to one end of the current path of the MOS transistor 28, the node N5 connected to the gate, and the other end of the current path is connected to the other end of the current path of the MOS transistor 27.

The MOS transistors 27 and 28 are elements used in the second embodiment and the MOS transistor 28 functions as a detection unit (hereinafter, may be referred to as the SEN node) for detecting the read data.

One end of the current path of the MOS transistor 29 is connected to an INV_T, the other end connected to the node N5, and a signal TTI is supplied to the gate. A voltage level of the signal TTI is a voltage V2 (<voltage V1) smaller than the voltage V1.

That is, since a current driving force of the MOS transistor 26 is greater than that of the MOS transistor 29, if the voltage is supplied through the MOS transistor 36, a voltage value of the LAT_T becomes greater than a voltage value of the INV_T.

TDL

The TDL may hold the write data and the read data. Here, the read data will be described.

Specifically, the TDL holds data of the node LAT_T. For example, if the read data is "0", the voltage level of the LAT_T becomes an "H" level.

In contrast, if the read data is "1", the voltage level of the LAT_T becomes an "L" level. Hereinafter, a configuration of the TDL will be described.

One end of the current path of the MOS transistor 30 is connected to the LAT_T, the other end of the current path connected to a power supply D (ground potential or the voltage VDD is supplied), and a signal INV_T is supplied to the gate.

One end of the current path of the MOS transistor 31 is connected to the INV_T, the other end of the current path connected to the power supply D (ground potential or the voltage VDD is supplied), and the signal LAT_T is supplied to the gate.

In order to temporarily disable the function of the TDL at the time of sensing, the control unit 6 makes a voltage value of the power supply D be the voltage VDD. Thus, the voltage VDD is supplied to one end of the current path of the MOS transistors 30 and 31.

One end of the current path of the MOS transistor 32 is connected to the LAT_T and a signal TLL_T is supplied to the gate.

One end of the current path of the MOS transistor 33 is connected to the INV_T and the signal LAT_T is supplied to the gate.

The MOS transistors 30 to 35 are a transistor group for transporting a predetermined voltage to the bit line BL and functions as a latch circuit (TDL).

The voltage VDD is supplied to one end of the current path of the MOS transistor 34, the other end of the current path connected to the other end of the MOS transistor 32, and the signal INV_T is supplied to the gate.

The voltage VDD is supplied to one end of the current path of the MOS transistor 35, the other end of the current path connected to the other end of the MOS transistor 33, and the signal LAT_T is supplied to the gate.

In the first embodiment, the read data detected by a node SEN is stored in the TDL through the MOS transistor 19 and the MOS transistor 26.

A voltage VDDPRE is supplied to one end of the current path of the MOS transistor 36, the other end connected to the node N5, and a signal LPC is supplied to the gate.

The wiring to which the node N5 is connected is referred to as wiring LBUS and the MOS transistor 36 has a function of charging the wiring LBUS.

One end of the current path of the MOS transistor 37 is connected to a DBUS, the other end connected to the node N5, and a signal DSW is supplied to the gate.

The MOS transistor 37 is turned on and off in response to the signal DSW and thereby data transfer to an XDL (not illustrated) connected to wiring DBUS is performed.

Reading Operation

Next, the reading operation will be described with reference to FIGS. 3 and 4.

The control unit 6 controls the voltage level of each signal and timing thereof.

Figure 4:
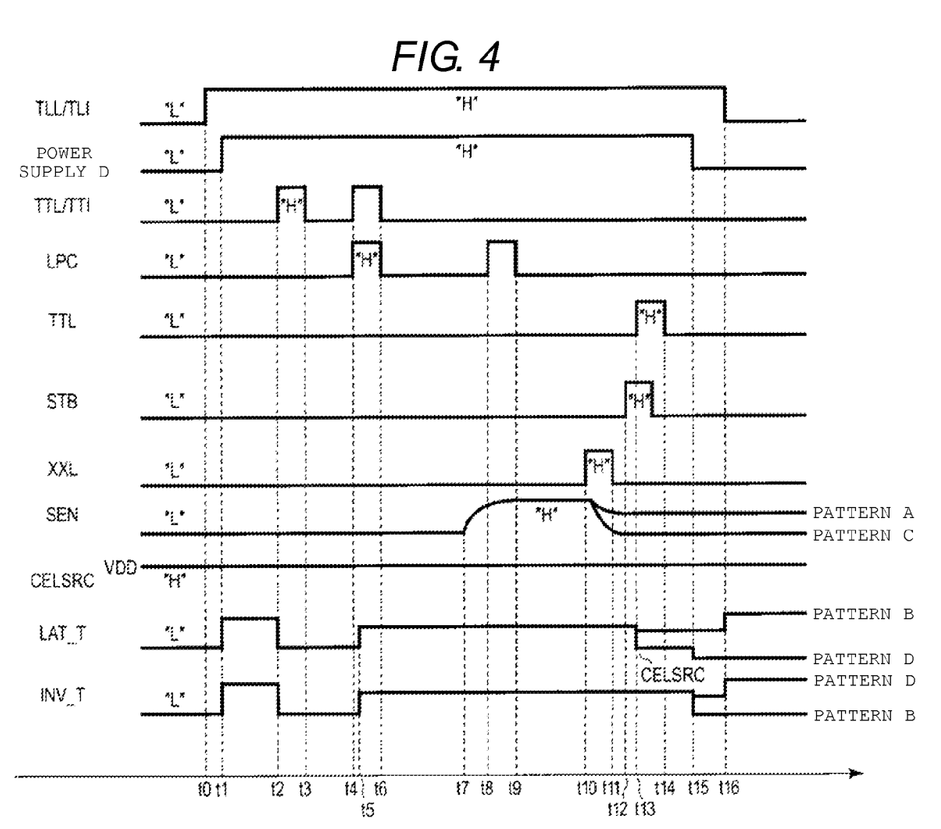
FIG. 4 is a timing diagram of a reading operation according to the first embodiment.

First, as illustrated in FIG. 4, the control unit 6 makes the voltage levels of signals TLL and TLI at a time t0 be "H". Thus, the MOS transistors 32 and 33 are turned off.

Figure 3:
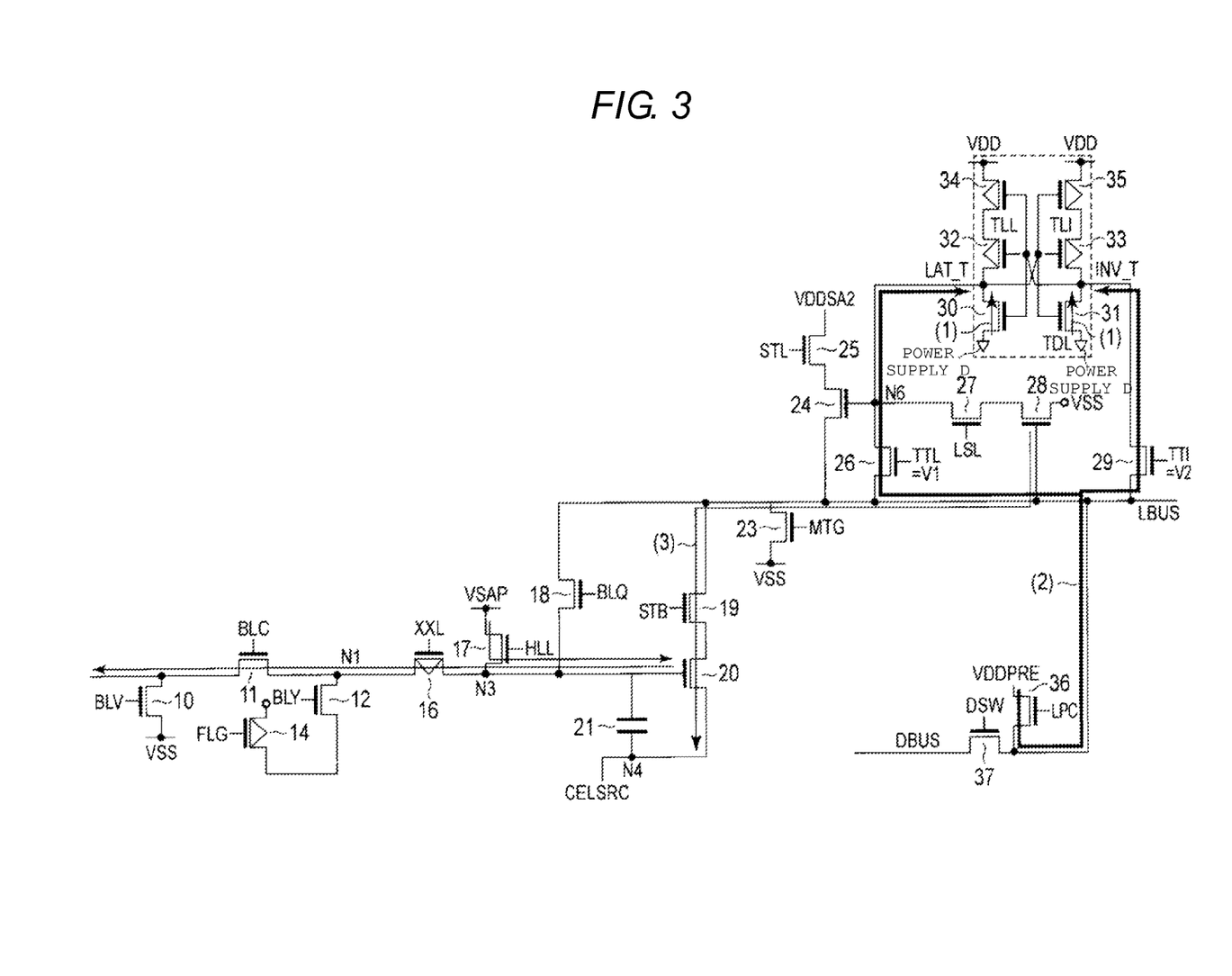
FIG. 3 is a conceptual diagram illustrating an operation of the sense amplifier according to the first embodiment.

Thereafter, at a time t1, the control unit 6 supplies the voltage VDD to one end of the current path of the MOS transistors 30 and 31 ((1) in FIG. 3). Thus, the potential is the same potential as that of the voltage VDD supplied to one end of the current path of the MOS transistors 34 and 35, and at the same time as the time t1, the voltage level of the INV_T and the LAT_T becomes an intermediate potential (in a state where the potential is not determined).

As a result, the control unit 6 makes the TDL be inactive. Thereafter, at a time t2, the control unit 6 makes the voltage level of a signal TTL/TTI be "H" and thereby the LAT_T and the INV_T are grounded to the wiring LBUS (at this time, the voltage level of the wiring LBUS is "L").

Next, at a time t4, in order to make the MOS transistors 26 and 29 be in the ON state, the control unit 6 makes the voltage level of the signal TTL be "H (the voltage V1)" and the voltage level of the signal TTI be "H (voltage V2<voltage V1)".

Here, the voltage V2<the voltage V1 is provided because the node of one side is a reference potential at the time of sense by providing a constant potential difference between the INV_T and the LAT_T described below.

In the embodiment, a value of the INV_T is a reference voltage.

Holding data depending on whether the potential of the LAT_T after the sensing operation is large or small with respect to the reference voltage is stored in the TDL.

Determination of the holding data of the TDL is achieved in transition from the voltage VDD of the power supply D to the voltage VSS.

Thereafter, at a time t5, the control unit 6 makes the voltage level of the signal TTL and the signal TTI be "H" again while at the same time making the voltage level of the signal LPC be "H".

Thus, as indicated by (2) in FIG. 3, the voltage V1 is supplied from the MOS transistor 36 to the LAT_T through the MOS transistor 26 and the voltage V2 is supplied to the INV_T through the MOS transistor 29.

As a result, at a time t6, the LAT_T is charged to the voltage V1 and the INV_T is charged to the voltage V2.

Thereafter, the control unit 6 makes the voltage level of the signal HLL be "H". Thus, the node SEN is increased to the voltage VX2 by the MOS transistor 17.

The control unit 6 reads out the holding data of the memory cell MC of interest after preparation so far is performed.

As a reading method, a voltage VCGR is supplied to the selected word line WL and a voltage VREAD is supplied to other non-selected word line WL and thereby the holding data of the memory cell MC is read out according to a current amount flowing in the NAND string 7.

The result of the sensing is one of patterns of a case where the charge of the SEN node is discharged to the source line SL and a case where the charge is maintained in the vicinity of the voltage VX2 without being discharged.

(1) Case where Charge of SEN Node is not Discharged (Pattern A)

If the memory cell MC connected to the selected word line WL is turned off, the NAND string 7 is turned off, and thus at a time t10, even if the signal XXL is in the ON state, the voltage of the node SEN maintains in the vicinity of the voltage VX2. That is, the node SEN becomes a waveform of a pattern A in FIG. 4.

Next, at a time t12, the control unit 6 makes the voltage level of the signal STB be "H" and next, at a time t13, the voltage level of the signal TTL be "H".

In the case of the pattern A, since the MOS transistor 20 is in the ON state, the voltage level of the LAT_T is decreased from "H" (V1) to the CELSRC.

As a result, the MOS transistor 35 enters the ON state and the MOS transistor 31 enters the OFF state.

At this time, since the INV_T="H" (voltage V2), the MOS transistor 30 is in the ON state.

Thereafter, at a time t15, the control unit 6 performs transition of the power supply D to the voltage VSS. That is, the TDL is active and a value depending on the potential difference between the INV_T ("H"=V2) and the LAT_T ("CELSRC") is stored in the TDL.

Specifically, a potential difference between a source end and the gate of the MOS transistor 30 is increased and the voltage level of the LAT_T goes from the CELSRC to the ground potential ("L") (pattern D in FIG. 4).

Thereafter, at a time t16, the control unit 6 makes the voltage levels of the signal TLL and the signal TLI be respectively "L". As a result, since the MOS transistor 33 is turned on, as indicated by the pattern D in FIG. 4, the voltage level of the INV_T becomes "H".

The TDL holds "0" data by the operation described above.

(2) Case where Charge of SEN Node is Discharged (Pattern C)

In contrast, if the memory cell MC connected to the selected word line WL is turned on, the NAND string 7 is turned on. As a result, at a time t10, the signal XXL is turned on, as indicated by (3) in FIG. 3, and the voltage of the SEN node is discharged to the source line SL. That is, as illustrated in FIG. 3, the node SEN becomes a waveform of the pattern C.

As a result, the lower limit value of the node SEN becomes (voltage value of the source line SL+voltage amplitude of the bit line BL).

Next, at a time t12, the control unit 6 makes the voltage level of the signal STB be "H" and, next, at a time t13, makes the voltage level of the signal TTL be "H".

Since the MOS transistor 20 is in the OFF state, the voltage level of the LAT_T maintains "H" (V1).

Thus, the MOS transistor 35 enters the OFF state and the MOS transistor 31 enters the ON state. That is, since the voltage level of the INV_T transits from "H" (V2) to "L", the MOS transistor 34 enters the ON state and the MOS transistor 30 is turned off.

Thereafter, at a time t15, the control unit 6 drops the power supply D to the voltage VSS. That is, the TDL is active and a value corresponding to the potential difference between the INV_T ("L") and the LAT_T (V1) is stored in the TDL.

Specifically, since the potential difference between one end (source end) of the current path of the MOS transistor 31 and the gate transited to "L" becomes large, a current driving force of the MOS transistor 31 is increased and as indicated by a pattern B in FIG. 3, the INV_T becomes the ground potential.

Next, at the time t16, the voltage levels of a signal TLL and the signal TLI are respectively "L".

As a result, since the MOS transistor 32 turns on, as indicated by the pattern B in FIG. 3, the voltage level of the LAT_T is "H" and the TDL maintains the "1" data.

Second Embodiment

Next, a non-volatile semiconductor memory device according to a second embodiment will be described with reference to FIGS. 5 and 6.

In the second embodiment, a reading operation is performed while regarding wiring LBUS provided in a sense amplifier 3 as a capacitance of a capacitor element. Thus, in the second embodiment, a capacitor element 21 and a plurality of MOS transistors on a periphery thereof may be omitted.

Moreover, in the second embodiment, a MOS transistor 28 has a function of an SEN node as described above.

Moreover, description of the same configuration and the reading operation as those in the first embodiment described above will be omitted.

Sense Amplifier 3

A sense amplifier 3 according to the second embodiment employs a configuration same as the configuration of the sense amplifier 3 according to the first embodiment except that the total number of MOS transistors and capacitor elements are reduced.

Figure 2:
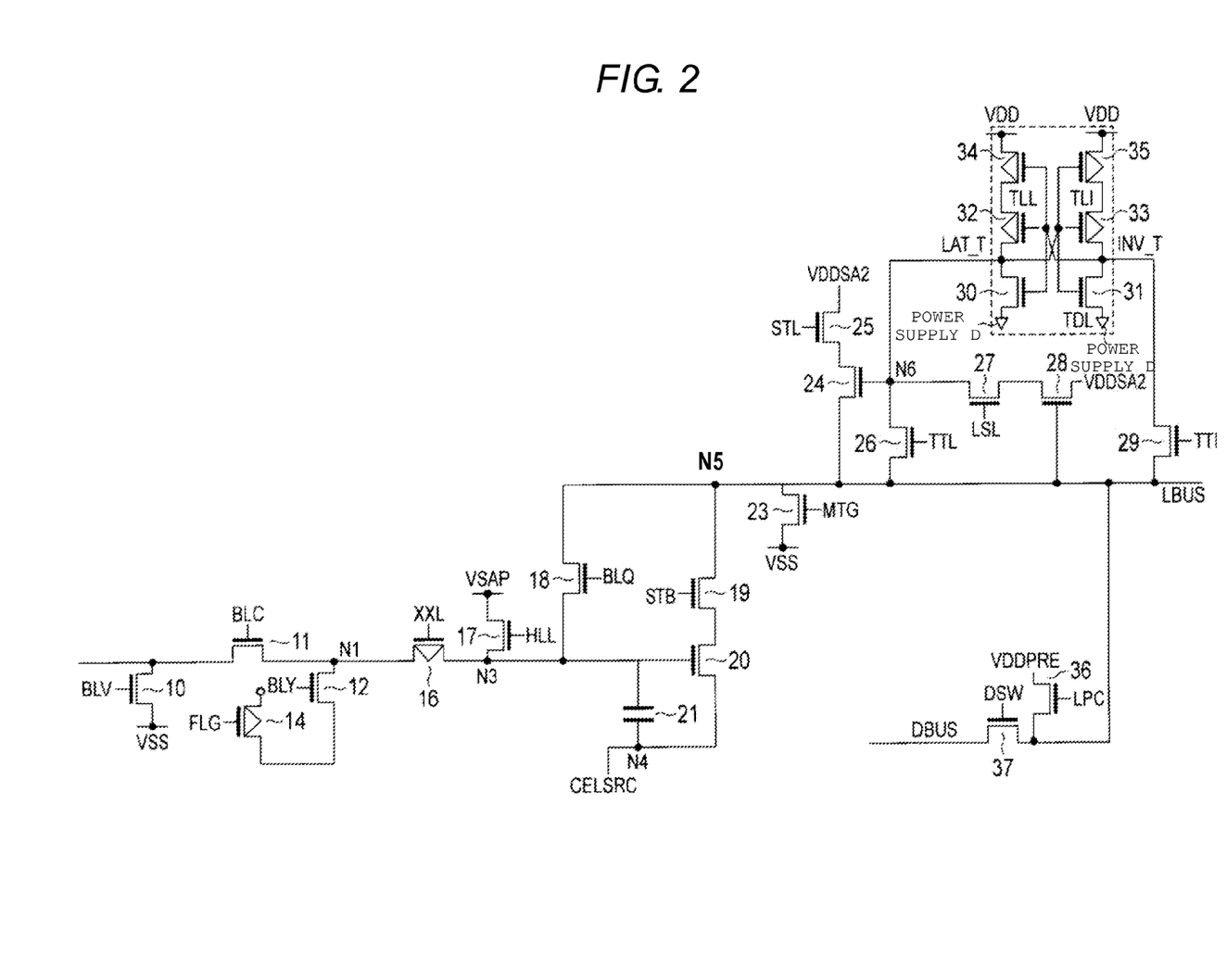
FIG. 2 is a circuit diagram of a sense amplifier according to the first embodiment.

Specifically, the sense amplifier 3 according to the second embodiment employs a configuration same as in FIG. 2 except that the MOS transistors 16, 17, 19, and 20, and the capacitor element 20 are removed.

Figure 5:
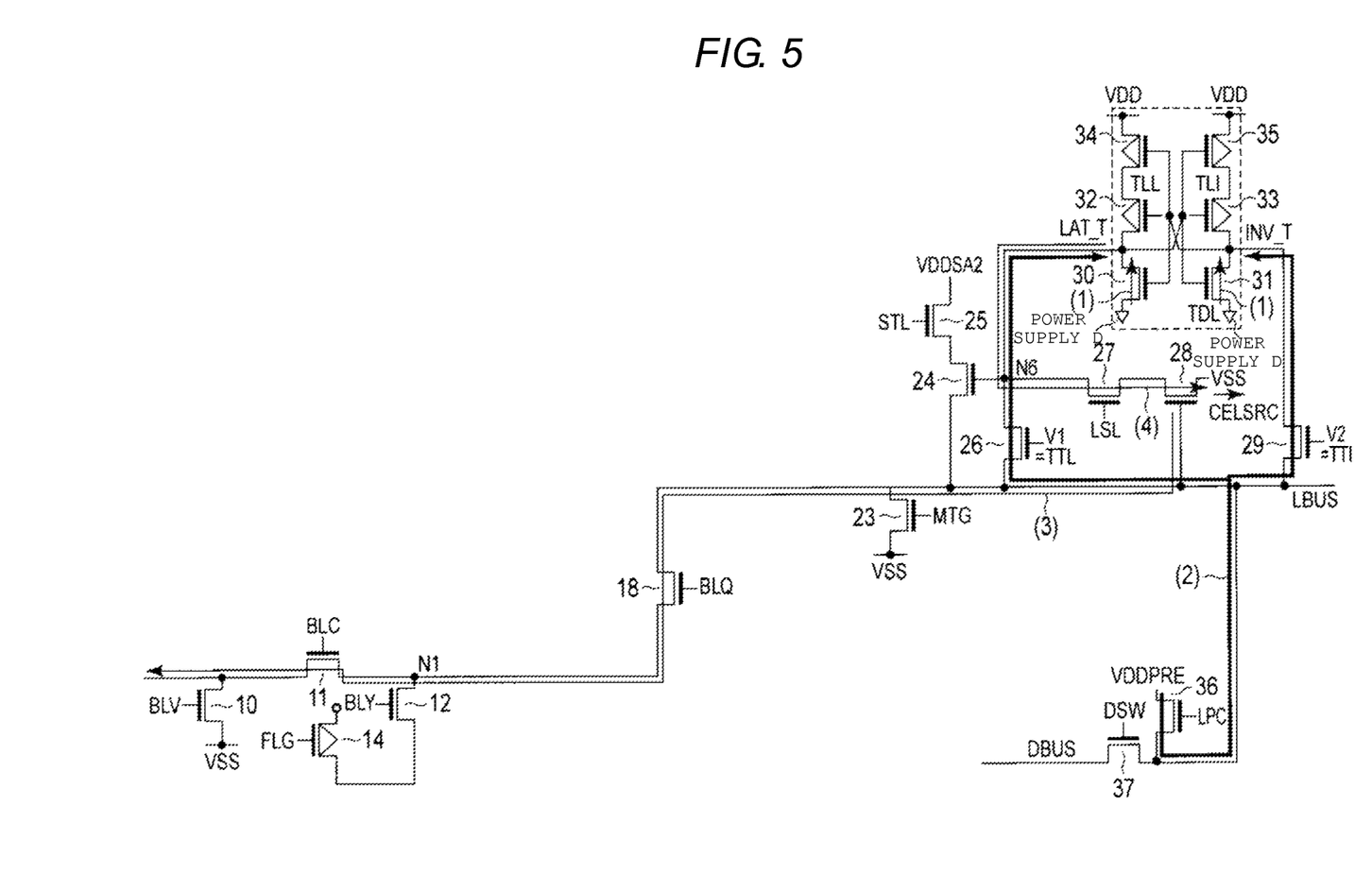
FIG. 5 is a conceptual diagram illustrating an operation of a sense amplifier according to a second embodiment.

This configuration is illustrated in FIG. 5.

Reading Operation

Next, the reading operation will be described with reference to FIG. 5.

Moreover, a control unit 6 controls a voltage level of each signal and timing thereof.

Figure 6:
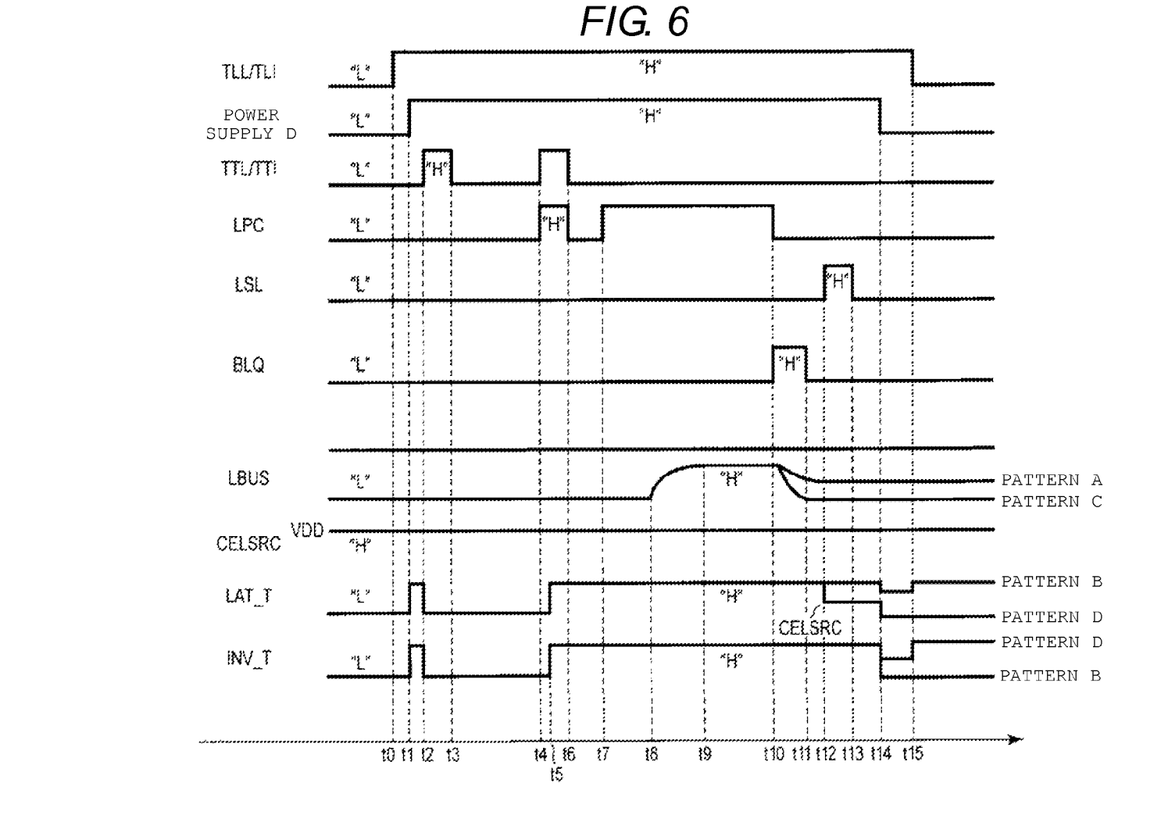
FIG. 6 is a timing diagram of a reading operation according to the second embodiment.

As illustrated in FIG. 6, at a time t1, the control unit 6 makes a value of a power supply D from a VSS to a voltage VDD. Thus, the voltage levels of an INV_T and an LAT_T become an intermediate potential (state where the potential is not determined).

Thereafter, the control unit 6 discharges the voltage charged in the INV_T and the LAT_T.

Furthermore, at a time t4, the control unit 6 makes the voltage levels of a signal LPC, a signal TTL, and a signal TTI be "H" and makes the voltage levels of the INV_T and the LAT_T be "H" through the MOS transistor 36 ((1) in FIG. 5).

Moreover, also in the embodiment, since the voltage level (voltage V1) of the signal TTL is greater than the voltage level (voltage V2) of the signal TTI, the voltage level is the LAT_T>the INV_T.

Next, after the MOS transistors 26 and 29 are turned off, at a time t7, the control unit 6 makes the voltage level of the signal LPC be "H (voltage VDD+VX2)" again.

Thus, the wiring LBUS is charged to the voltage VX2 in the following manner.

At a time t8, the potential of the wiring LBUS is increased and at a time t9, reaches the voltage VX2.

Next, at a time t10, the control unit 6 makes the voltage level of the signal BLQ be "H" and thereby the MOS transistor 18 enters the ON state and the wiring LBUS is connected to the bit line BL.

The result of the sensing is one of patterns of a case where the charge of the wiring LBUS is discharged to the source line SL and a case where the charge is maintained in the vicinity of the voltage VX2 without being discharged.

(1) Case where Charge is Discharged (Pattern C)

When the charge of the wiring LBUS is discharged, at a time t12, even if the control unit 6 makes the voltage level of the signal LSL be "H", since the MOS transistor 28 is in the OFF state, the LAT_T maintains the "H" level.

Then, since the voltage level of the LAT_T is higher than the voltage level of the INV_T, the MOS transistor 31 enters the ON state and in contrast, the MOS transistor 30 lightly enters the OFF state.

Thereafter, at a time t14, the control unit 6 drops a value of the power supply D to the VSS. Thus, since the potential difference between one end (source end) of the current path of the MOS transistor 31 and the gate is increased, a current driving force of the MOS transistor 31 is increased and the INV_T becomes the ground potential. That is, a waveform of the pattern B is illustrated in FIG. 6.

Next, at a time t15, the control unit 6 makes the voltage levels of the signal TLL and the signal TLI be "L", whereby the MOS transistors 32 and 33 enter the ON state.

Then, since the MOS transistor 34 is in the ON state, the voltage VDD is supplied to the LAT_T through the MOS transistors 34 and 32. That is, the voltage level of the LAT_T becomes "H". That is, as a result of the reading, the "1" data is stored. Moreover, in this case, that is, the waveform of the pattern B is illustrated in FIG. 6.

(2) Case where Charge is not Discharged (Pattern A)

In this case, since the MOS transistor 28 is in the ON state, at a time t12, if the control unit 6 makes the voltage level of the signal LSL be "H", the charge of the LAT_T is discharged through the MOS transistors 27 and 28. Moreover, here, the voltage of the other end of the current path of the MOS transistor 28 is a voltage CELSRC greater than that of the VSS. That is, the voltage of the LAT_T is discharged to near the CELSRC.

Here, because it is necessary to artificially increase a Trip Point of the MOS transistor 28, the voltage CELSRC is supplied to the other end of the current path of the MOS transistor 28.

Furthermore, since the voltage of the LAT_T is the CELSRC, the MOS transistor 31 enters the OFF state and the MOS transistor 30 enters the ON state.

Thereafter at a time t14, the control unit 6 drops the voltage level of the power supply D from the voltage VDD to the VSS, whereby the potential difference between the source end of the MOS transistor 30 and the gate is increased.

As a result, the current driving force of the MOS transistor 30 is increased and the voltage level of the LAT_T becomes the ground potential. That is, the voltage level becomes "L" and the waveform of the pattern D is illustrated in FIG. 6.

Thereafter, at a time t15, the control unit 6 makes the voltage levels of the signal TLL and the signal TLI be "L". Since the MOS transistor 35 is in the ON state, when the MOS transistor 33 is turned on, the voltage VDD is supplied to the INV_T by the MOS transistors 33 and 35. That is, the voltage level of the INV_T becomes "H" and the TDL holds "0" data.

Effects According to Second Embodiment

According to the non-volatile semiconductor memory device of the second embodiment, since the total number of MOS transistors and capacitor elements may be reduced, it is possible to reduce the circuit in size by a volume that is occupied by those elements.

There are three reasons.

(1-1) First, it is because a wiring capacitance of the wiring LBUS is used instead of the capacitor element 21.

The wiring capacitance of the wiring LBUS has a value comparable to the capacitance of the capacitor element 21. Thus, a substitution of the capacitor element 21 is achieved by using charging and discharging of the charge stored in the wiring LBUS. That is, it is possible to eliminate the capacitor element 21 by relying on the capacitance of the existing wiring LBUS.

In the related art, the clock is input into one electrode of the capacitor element 21 and the voltage of the node SEN is increased, whereby a sufficient sense margin is obtained, but if the capacitor element 21 is not used, the method in the related art cannot be used.

Thus, it is possible to increase the sense margin of the node SEN as with the related art by employing a method of the following (1-2), and it is possible to perform sense as with the related art. This leads to the second reason.

(1-2) Second, the CELSRC (>VSS) is supplied to the other end (source end) of the current path of the MOS transistor 28.

Thus, it is possible to relatively increase the Trip Point (threshold level) in which the MOS transistor 28 is turned on and off. As a result that the sensing is performed and the charge stored in the wiring LBUS is discharged, the voltage value of the wiring LBUS is near (CELSRC+amplitude voltage of the bit line BL) as described above.

Then, it is necessary to adjust the Trip Point (threshold level) in which the MOS transistor 28 is turned on and off.

If the VSS is supplied to source end and any change is not made without performing such a method, the Trip Point of the MOS transistor 28 is only a threshold of the transistor itself. Thus, in the wiring LBUS having a voltage always higher than the threshold, the MOS transistor 28 is always turned on regardless of the holding data of the memory cell MC.

In order to prevent this, in the second embodiment, the voltage CELSRC is supplied to the other end of the current path of the MOS transistor 28.

(1-3) Third, the power supply portion (the power supply D) of the TDL has a function of pulling out the charge stored in the wiring LBUS.

As described in the first embodiment, even when the clock signal input into the capacitor element 21 is eliminated, if such an operation is performed in the TDL, it is possible to perform the sensing as in the related art and an effect that the circuit scale may be reduced is achieved.

Modified Example

A modified example according to the second embodiment will be described with reference to FIGS. 7 and 8.

The modified example described below is different from the embodiment in that the voltage value supplied to the TDL (the LAT_T, the INV_T, and the power supply D) at the time of sense and the supplying method are changed.

Specifically, there are two differences.

(1) The voltage value of the power supply D is transitioned from the ground potential (VSS) to the CELSRC at timing in which the voltage supplied to one end of the current path of the MOS transistors 34 and 35 is transitioned from the voltage VDD to the voltage VX2 at the time of sense.

(2) The pre-charging is not performed to the INV_T and the LAT_T through the MOS transistor 36, and the INV_T is grounded to the potential of the wiring LBUS of "L" and the voltage level of the LAT_T is made "H" through the MOS transistors 34 and 32 in the modified example.

Moreover, since the configuration of the sense amplifier 3 is the same as that of FIG. 5, the description will be omitted and the description of the same reading operation as that of the second embodiment will be omitted.

Moreover, hereinafter, the node of one end of the current path of the MOS transistors 34 and 35 is a node N7. As described below, the node N7 has a function of outputting the voltage VDD or the voltage VX2 to the LAT_T or the INV_T. Moreover, the node N7 may be an output (supply) end of a voltage generating circuit 5 (or step-up circuit (not illustrated)).

Reading Operation

Figure 7:
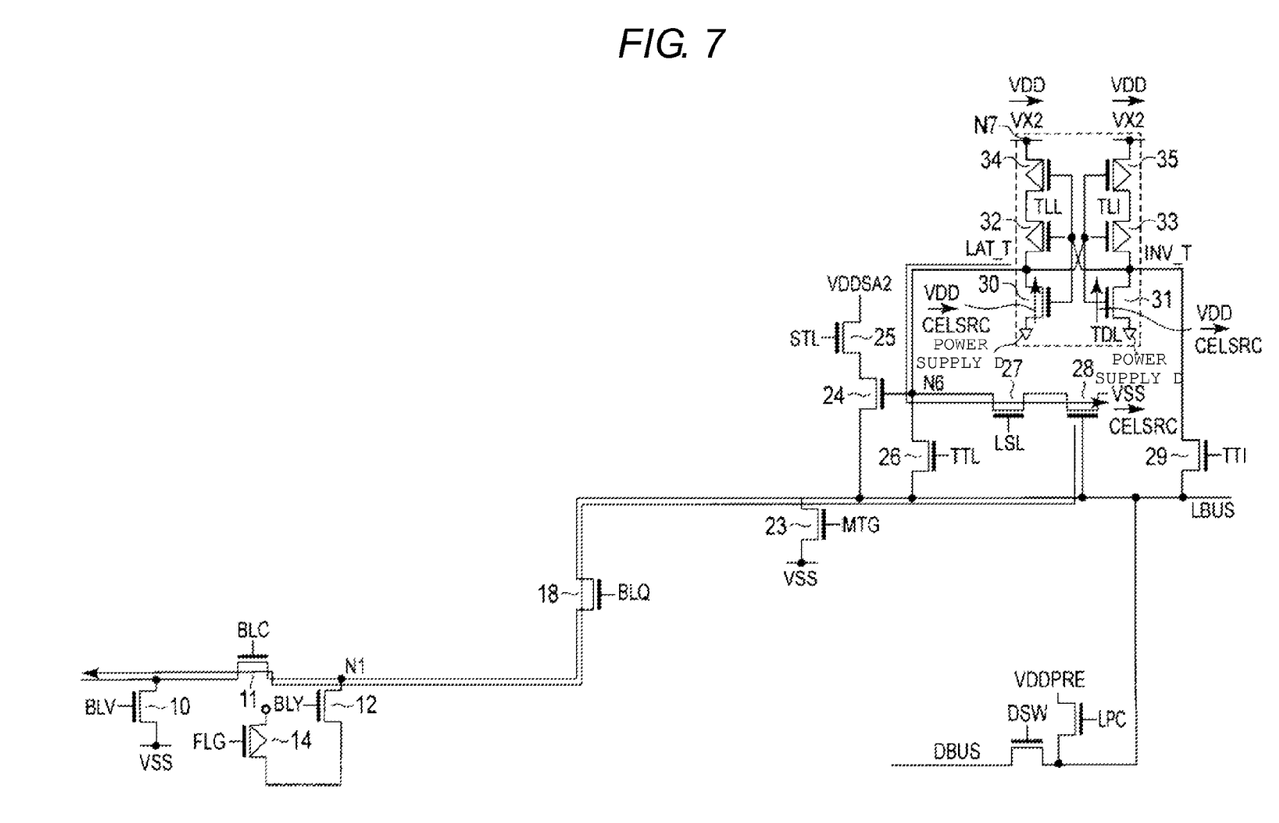
FIG. 7 is a conceptual diagram illustrating an operation of a sense amplifier according to a modified example of the second embodiment.
Figure 8:
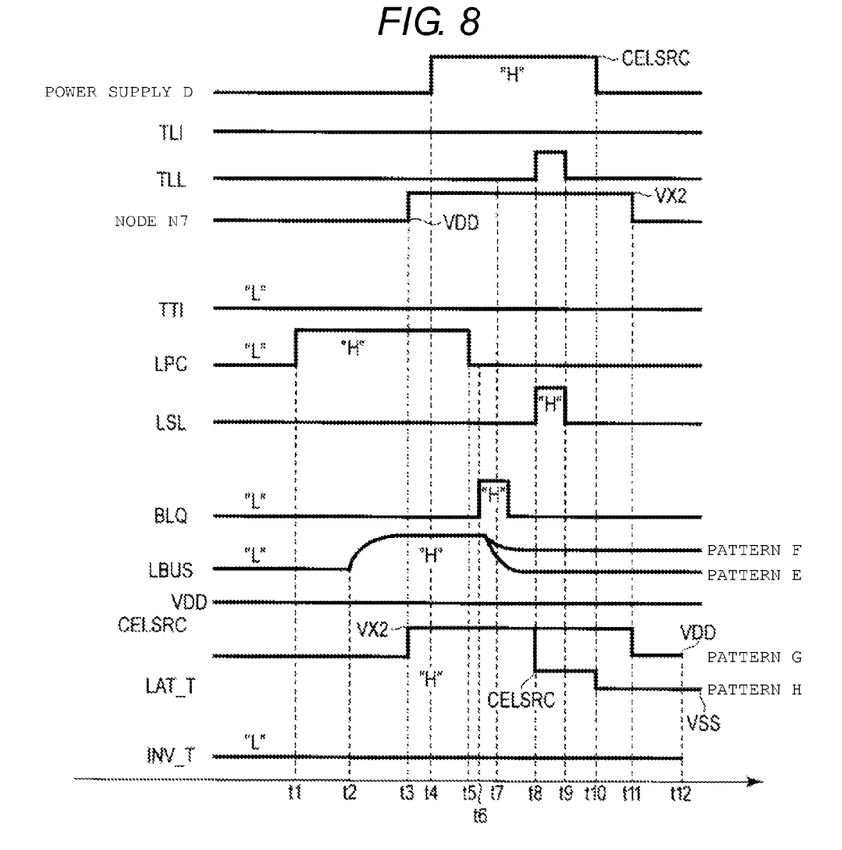
FIG. 8 is a timing diagram of a reading operation according to the modified example of the second embodiment.

Even though not illustrated in FIG. 8, first, the control unit 6 makes the voltage level of the signal TTI before the time t0 be "L" and a value of the node N7 be the voltage VDD (see FIG. 7).

Next, the control unit 6 makes the voltage level of the signal TTI be "H". Then, since the voltage level of the wiring LBUS is "L", the voltage level of the INV_T transits to "L".

Then, since the MOS transistor 34 is turned on, the MOS transistor 30 is turned off, and the MOS transistor 32 is also turned on, at the time t2, the voltage level of the LAT_T becomes "H" (voltage VDD).

In the operation up to here, the voltage level of the INV_T becomes "L" and the voltage level of the LAT_T becomes "H". That is, a potential difference between the INV_T and the LAT_T is provided.

Thereafter, at the time t1, the control unit 6 makes the voltage level of the signal LPC be "H". Thus, the voltage of the wiring LBUS is increased from the time t2 and reaches the VX2 at the time t3.

Furthermore, the control unit 6 increases the potential of the node N7 from the VDD to the voltage VX2 at the time t3. Thus, the voltage level of the LAT_T becomes VX2. Moreover, since the voltage level of the signal TLI is "L", the voltage level of the INV_T maintains "L".

Next, at the time t4, the control unit 6 increases the voltage level of the power supply D from "L" to "H" (CELSRC).

Furthermore, at the time t6, the control unit 6 makes the voltage level of the signal BLQ be "H", whereby the MOS transistor 18 enters the ON state and the wiring LBUS and the bit line BL are connected.

The result of the sensing becomes one of patterns of a case where the charge of the wiring LBUS is discharged to the source line SL and a case where the charge is maintained in the vicinity of the voltage VX2 without being discharged.

(1) Case where Charge is Discharged (Pattern E)

If the charge of the wiring LBUS is discharged, at the time t8, even when the control unit 6 makes the voltage level of the signal LSL be "H", since the MOS transistor 28 is in the OFF state, the LAT_T maintains "H" level (pattern G).

Thereafter, at the time t10 and the time t11, the potential of the node N7 changes from the VX2 to the VDD and a value of the power supply D changes from the CELSRC to the VSS, and thereby the voltage level of the LAT_T is determined to be "H".

(2) Case where Charge is not Discharged (Pattern F)

In this case, since the MOS transistor 28 is in the ON state, at the time t8, if the control unit 6 makes the voltage level of the signal LSL be "H", the charge of the LAT_T is discharged through the MOS transistors 27 and 28.

As described above, since the potential of the LAT_T is discharged, at the time t8, the control unit 6 makes the voltage level of the signal TLL be "H" in advance, whereby the MOS transistor 32 is turned off and a situation in which the current flows from the node N7 into the LAT_T is prevented.

Moreover, the voltage of the other end of the current path of the MOS transistor 28 is the voltage CELSRC higher than the VSS. That is, the voltage of the LAT_T is discharged to near the CELSRC (pattern H).

Thereafter, at the time t10 and time t11, the potential of the node N7 changes from the VX2 to the VDD and the value of the power supply D changes from the CELSRC to the VSS, and thereby the voltage level of the LAT_T is determined to be "L".

Effects According to Modified Example

According to the non-volatile semiconductor memory device of the modified example, it is possible to prevent blurring of the voltage level of the INV_T when the MOS transistor 29 is turned off (first effect).

In the first and second embodiments, the operation is performed in which the MOS transistor 29 is turned on when the INV_T is pre-charged and thereafter, the MOS transistor 29 is turned off.

Then, when the MOS transistor 29 is turned off, the voltage level of the INV_T may drop slightly.

In this case, also in the first and second embodiments, the INV_T may not sufficiently function as the reference voltage.

In contrast, according to the non-volatile semiconductor memory device of the modified example, since the sensing in which the INV_T is used as the reference voltage is not performed, first of the all, it is not necessary to perform the pre-charging of the INV_T.

That is, in the sensing of the modified example, the MOS transistor 29 is dropped to "L" and the sensing is performed on how the voltage level of the LAT_T is changed depending on the voltage level of the wiring LBUS.

As described above, since the voltage level of the INV_T is "L", it is possible to realize an accurate latching operation without blurring of the voltage level of the INV_T when the MOS transistor 29 is turned off.

Moreover, the same applies to prevention of blurring of the voltage of the LAT_T. That is, in the first and second embodiments described above, the MOS transistor 26 is turned off after the LAT_T is charged.

At this timing, the voltage level of the LAT_T may drop slightly.

However, according to the non-volatile semiconductor memory device of the modified example, since the voltage level of the LAT_T is charged through the MOS transistors 34 and 32, it is not necessary to pre-charge according to the method of the first and second embodiments described above.

As described above, since blurring of the voltage level of the LAT_T is not generated when the MOS transistor 26 is turned off, it is possible to realize the accurate latching operation.

Furthermore, according to the non-volatile semiconductor memory device of the modified example, it is possible to prevent loss of the data held in the TDL during the sensing by always activating the TDL (second effect).

That is, the LAT_T does not have a floating potential, and LAT_T is electrically connected to predetermined wiring.

In the non-volatile semiconductor memory device according to the first and second embodiments, the node N7 and the power supply D have the same potential.

Therefore, if the MOS transistors 30 to 35 are turned on, since the INV_T and the LAT_T have floating potentials (for example, intermediate potential), it is necessary to reset once the TDL before sense.

Otherwise, if the reset operation is not performed, the data held in the TDL may be destroyed when a next reading operation is performed. The non-volatile semiconductor memory device cannot use the data held in the TDL before the next reading operation.

However, according to the non-volatile semiconductor memory device of the modified example, since the potential difference of one of the VX2 and the CELSRC is provided between the node N7 and the power supply D, the LAT_T does not have a floating potential at the time of sensing.

For example, as a result of the sensing, if the voltage level of the LAT_T maintains "H" (voltage VX2), since the MOS transistor 31 is turned on, the voltage level of the INV_T is "L".

Thus, since the MOS transistor 34 is turned on, and at this timing, the MOS transistor 32 is turned on, the LAT_T supplies the voltage VX2 from the node N7.

Thus, the LAT_T maintains "H" without having a floating potential.

Furthermore, for example, as a result of the sensing, if the voltage level of the LAT_T is discharged to "L" (CELSRC), since the MOS transistor 30 is turned on, LAT_T is electrically connected to the power supply D. That is, LAT_T does not have a floating potential.

Moreover, as a result of the sensing, if the voltage level of the LAT_T is "L", since the MOS transistor 35 is turned on, and at this time, the MOS transistor 33 is also turned on, the voltage level of the INV_T transits from "L" to "H", whereby the MOS transistor 30 is turned on.

As described above, since the LAT_T does not have a floating potential, in the modified example, for the sensing operation, it is not necessary to reset once the data of the TDL, and it is possible to utilize the data held in the TDL until that.

Moreover, in each embodiment, (1) In the reading operation,

The voltage applied to the word line that is selected in the reading operation of the A level is, for example, between 0 V to 0.55 V. The voltage is not limited to this and may be one of between 0.1 V to 0.24 V, 0.21 V to 0.31 V, 0.31 V to 0.4 V, 0.4 V to 0.5 V, and 0.5 V to 0.55 V.

The voltage applied to the word line selected in the reading operation of the B level is, for example, between 1.5 V to 2.3 V. The voltage is not limited to this and may be one of between 1.65 V to 1.8 V, 1.8 V to 1.95 V, 1.95 V to 2.1 V, and 2.1 V to 2.3 V.

The voltage applied to the word line selected in the reading operation of the C level is, for example, between 3.0 V to 4.0 V. The voltage is not limited to this and may be one of between 3.0 V to 3.2 V, 3.2 V to 3.4 V, 3.4 V to 3.5 V, 3.5 V to 3.6 V, and 3.6 V to 4.0 V.

For example, a time (tR) of the reading operation may be between 25 µs to 38 µs, 38 µs to 70 µs, and 70 µs to 80 µs.

(2) The writing operation includes the program operation and verify operation described above. In the writing operation, it may be the following voltages in addition to 15.0 V to 23.0 V described above.

Specifically, the voltage initially applied to the word line selected during the program operation is, for example, between 13.7 V to 14.3 V. The voltage is not limited to this and, for example, may be one of between 13.7 V to 14.0 V and 14.0 V to 14.6 V.

The voltage initially applied to the word line selected when writing odd-numbered word lines may be exchanged with the voltage initially applied to the word line selected when writing even-numbered word lines.

When the program operation is performed with an Incremental Step Pulse Program (ISPP system), as a voltage for step-up, for example, approximately 0.5 V may be used.

Furthermore, as the voltage applied to the non-selected word lines, the following voltages may be used in addition to 7.0 V to 10.0 V described above.

Specifically, for example, as the voltage applied to the non-selected word lines, the voltage between 6.0 V to 7.3 V may be used. The voltage is not limited to this and, for example, the voltage may be between 7.3 V to 8.4 V or may be 6.0 V or less.

A pass voltage to be applied may be changed according to whether the non-selected word lines are the odd-numbered word lines or are the even-numbered word lines.

A time (tProg) of the writing operation, for example, may be between 1,700 µs to 1,800 µs, 1,800 µs to 1,900 µs, and 1,900 µs to 2,000 µs.

(3) In an erasing operation, the voltage initially applied to a well which is formed in an upper portion of the semiconductor substrate and on which the memory cells are disposed above is, for example, between 12 V to 13.6 V. The voltage is not limited to this and, for example, the voltage may be between 13.6 V to 14.8 V, 14.8 V to 19.0 V, 19.0 V to 19.8 V, and 19.8 V to 21 V.

A time (tErase) of the erasing operation, for example, may be between 3,000 µs to 4,000 µs, 4,000 µs to 5,000 µs, and 5,000 µs to 9,000 µs.

(4) The structure of the memory cells has the charge storage layer disposed on the semiconductor substrate (silicon substrate) through a tunnel insulation film having a film thickness of 4 nm to 10 nm. The charge storage layer may have a laminated structure of an insulation film such as SiN or SiON having a film thickness of 2 nm to 3 nm and polysilicon having a film thickness of 3 nm to 8 nm. Furthermore, a metal such as Ru may be added to the polysilicon. An insulation film is provided on the charge storage layer. For example, the insulation film has a silicon oxide film having a film thickness of 4 nm to 10 nm interposed between a lower layer High-k film having a film thickness 3 nm to 10 nm and an upper layer High-k film having a film thickness of 3 nm to 10 nm. The High-k film includes HfO and the like. Furthermore, the film thickness of the silicon oxide film may be greater than the film thickness of the High-k film. A control electrode having a film thickness of 30 nm to 70 nm is formed on the insulation film through a material having a film thickness of 3 nm to 10 nm. Here, the material for work function adjustment is a metal oxide film such as TaO and a metal nitride film such as TaN. W and the like may be used for the control electrode.

Furthermore, it is possible to form an air gap between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a memory cell;
    a bit line electrically connected to the memory cell;
    a sense amplifier electrically connected to the bit line, the sense amplifier including a latch unit configured to hold data read from the memory cell and transmitted through the bit line and a first node, a first transistor having a first end electrically connected to the latch unit and a second end electrically connected to the first node, a second transistor having a first end electrically connected to the first node and a second end electrically connected to the bit line, a third transistor having a first end electrically connected to a second node between the first end of the first transistor and the latch unit; and a control unit that controls the sense amplifier during a read operation, to charge the second node to a first voltage by turning on the first transistor for a period of time, and then, while the first transistor is in an off state, charge the first node to a second voltage, turn on the second transistor after charging the first node to the second voltage, and turn on the third transistor after turning on the second transistor.

2. The device according to claim 1, wherein the sense amplifier further includes a fourth transistor having a first end electrically connected to a voltage source and a second end electrically connected to the first node and the control unit, during the read operation, turns on the fourth transistor to charge the second node to the first voltage.

3. The device according to claim 2, wherein the control unit, during the read operation, turns off the first transistor prior to charging the first node to the second voltage.

4. The device according to claim 3, wherein the control unit, during the read operation, turns off the fourth transistor at the same time as the first transistor and then turns on the fourth transistor prior to charging the first node to the second voltage.

5. The device according to claim 4, wherein the control unit, during the read operation, turns off the fourth transistor prior to turning on the second transistor.

6. The device according to claim 5, wherein the control unit, during the read operation, turns off the second transistor prior to turning on the third transistor.

7. The device according to claim 6, wherein the sense amplifier further includes a fifth transistor having a first end electrically connected to a second end of the third transistor, a second end electrically connected to ground, and a gate electrically connected to the first node.

8. A reading method of a non-volatile semiconductor memory device having a memory cell, a bit line electrically connected to the memory cell and a sense amplifier electrically connected to the bit line, the sense amplifier including a latch unit configured to hold data read from the memory cell and transmitted through the bit line and a first node, a first transistor having a first end electrically connected to the latch unit and a second end electrically connected to the first node, a second transistor having a first end electrically connected to the first node and a second end electrically connected to the bit line, and a third transistor having a first end electrically connected to a second node between the first end of the first transistor and the latch unit, said method comprising:

charging the second node to a first voltage by turning on the first transistor for a period of time, and then while the first transistor is turned off, charging the first node to a second voltage, turning on the second transistor after charging the first node to the second voltage, and turning on the third transistor after turning on the second transistor.

9. The method according to claim 8, wherein the sense amplifier further includes a fourth transistor having a first end electrically connected to a voltage source and a second end electrically connected to the first node, and the method further comprises:

turning on the fourth transistor to charge the second node to the first voltage.

10. The method according to claim 9, wherein the first transistor is turned off prior to charging the first node to the second voltage.

11. The method according to claim 10, further comprising:

turning off the fourth transistor at the same time as the first transistor and then turning on the fourth transistor prior to charging the first node to the second voltage.

12. The method according to claim 11, further comprising:

turning off the fourth transistor prior to turning on the second transistor.

13. The method according to claim 12, further comprising:

turning off the second transistor prior to turning on the third transistor.

14. The method according to claim 13, wherein the sense amplifier further includes a fifth transistor having a first end electrically connected to a second end of the third transistor, a second end electrically connected to ground, and a gate electrically connected to the first node.

15. A reading method of a non-volatile semiconductor memory device having a memory cell, a bit line electrically connected to the memory cell and a sense amplifier electrically connected to the bit line, the sense amplifier including a latch unit configured to hold data read from the memory cell and transmitted through the bit line and a first node, a first transistor having a first end electrically connected to the latch unit and a second end electrically connected to the first node, a second transistor having a first end electrically connected to the first node and a second end electrically connected to the bit line, a third transistor having a gate electrically connected to the first end of the second transistor, and a fourth transistor having a first end electrically connected to the first node and a second end electrically connected to a first end of the third transistor, said method comprising:

charging a second node between the first end of the first transistor and the latch unit to a first voltage by turning on the first transistor for a period of time, and then while the first transistor is turned off, charging the first node to a second voltage, turning on the second transistor after charging the first node to the second voltage, and turning on the fourth transistor after turning on the second transistor.

16. The method according to claim 15, wherein the sense amplifier further includes a fifth transistor having a first end electrically connected to a voltage source and a second end electrically connected to the first node, and the method further comprises:

turning on the fifth transistor to charge the second node to the first voltage.

17. The method according to claim 16, wherein the first transistor is turned off prior to charging the first node to the second voltage.

18. The method according to claim 17, further comprising:

turning off the fifth transistor at the same time as the first transistor and then turning on the fifth transistor prior to charging the first node to the second voltage.

19. The method according to claim 18, further comprising:

turning off the fifth transistor prior to turning on the second transistor.

* * * * *